United States Patent [19]
Suzuki et al.

[11] Patent Number: 4,868,095
[45] Date of Patent: Sep. 19, 1989

[54] METHOD OF TREATING PHOTORESISTS

[75] Inventors: Shinji Suzuki; Kazuyoshi Ueki; Hiroko Suzuki, all of Kawasaki; Yoshiki Mimura, Yokohama, all of Japan

[73] Assignee: Ushio Denki, Tokyo, Japan

[21] Appl. No.: 149,308

[22] Filed: Jan. 28, 1988

[30] Foreign Application Priority Data

Mar. 24, 1987 [JP] Japan ............................ 62-67887

[51] Int. Cl.⁴ .................................... G03C 5/36
[52] U.S. Cl. ................................. 430/326; 430/328
[58] Field of Search ............... 430/311, 328, 330, 326, 430/327

[56] References Cited

U.S. PATENT DOCUMENTS

4,749,436  6/1988  Minato et al. .................. 156/345

OTHER PUBLICATIONS

Moran et al., "Plasma Treatment to Improve Resist Properties...", J. Vac. Sci. Technol., 19(4), Nov./Dec. 1981, pp. 1127–1131.
Allen et al., "Deep UV Hardening of Positive Photoresist...", Xerox Palto Alto Research Center, Accelerated Brief Comm., 1982, pp. 1379–1381.
H. Hiraoka and J. Pacansky: J. Vac. Sci. Tech. 19 (1981), p. 1132.
H. Hiraoka and J. Pacansky: J. Electrochem. Soc., 128 (1981) p. 2645.
R. Allen et al.: J. Electrochem. Soc., 129 (1982), p. 1379.
J. C. Matthews and J. I. Willmott, Jr.: Microlithography III Spie, (1984).
Y. Takasu et al.: Proc. Dry Process Symposium, (1984), p. 60.
H. Yanazawa et al.: J. Appl. Polymer Sci., 30 (1985) p. 547.

Primary Examiner—Jose G. Dees
Attorney, Agent, or Firm—Armstrong, Nikaido, Marmelstein, Kubovcik & Murray

[57] ABSTRACT

Ultraviolet radiation process applied to manufacture semiconductor devices in order to enhance the thermal stability of the photoresist film on semiconductor wafers.

A method, in ultraviolet radiation process, enabling effective treatment of the developed positive photoresist image employing ultraviolet irradiation by preventing the deformation of the developed positive photoresist image which is caused by exposing it to high ultraviolet radiation at the beginning of exposure. This method employs ultraviolet irradiation, in which the developed positive photoresist image placed in gas of a lower atmospheric pressure is exposed to ultraviolet radiation of low intensity at the beginning of exposure, and then exposed to ultraviolet radiation, the intensity of which increases little by little or in steps.

1 Claim, 2 Drawing Sheets

METHOD OF TREATING PHOTORESISTS

BACKGROUND OF THE INVENTION

1. Field of the Invention

This invention relates to a method of treating photoresist materials applied on a semiconductor wafer and, more particularly, to a method of treating the developed positive photoresist image on a wafer in a chamber by employing ultraviolet irradiation.

2. Description of the Prior Art

As for the prior-art treatment of positive photoresist employing ultraviolet irradiation, exposing the photoresist to ultraviolet radiation is utilized in a treatment in which the same pattern as a mask pattern is formed on the photoresist film applied on a semiconductor wafer, etc., and recently attention has been paid to the application of this method to particular treatments such as the treatment of baking said photoresist film on a wafer.

The baking process is employed, between a process of "forming a photoresist pattern, exposing and developing the photoresist" and a process of "executing ion implantation, plasma-etching, etc.", and said process is composed of a heating process executed for improving the adhesiveness of the photoresist to a semiconductor wafer and heat-resistance of said photoresist. Studies have been made recently on a method in which ultraviolet rays are applied to the developed positive photoresist image after or during the baking process after "development process" so as to enhance the heat-resistance and plasma-resistance of the positive photoresist through the baking process in a shorter time. Theses method are described in a reference of H. Hiroaka and J. Pacansky: J. Vac, Sci. Tech. 19 (1981), and U.S. Application No. 923,250. When a light having a high ultraviolet intensity is applied to the photoresist at the beginning of exposure, however, organic solvent included in the photoresist is decomposed and evaporated, or photochemical reactions take place in the photoresist itself or in the chemical agents which are applied to a wafer as preliminary treatment for the good coating of the photoresist onto a wafer, and then a gas is generated from the photoresist, and this gas causes deformation or breakdown of a developed positive photoresist film.

SUMMARY OF THE INVENTION

An object of this invention is to provide a method enabling effective treatment of the developed positive photoresist image prepared on a semiconductor wafer placed in a chamber employing ultraviolet irradiation by preventing the deformation of the photoresist image which is caused by exposing same to high ultraviolet radiation at the beginning of exposure.

In this invention, the photoresist image placed in a chamber filled with gas of lower pressure than 1 atmospheric pressure is exposed to ultraviolet radiation of lower intensity at the beginning of exposure process, and then exposed to ultraviolet radiation, the intensity of which increases little by little or in steps in said exposure process.

In this way, the aforementioned gas is generated slowly from the photoresist materials and released little by little to the space in a chamber. Moreover, the intensity of ultraviolet radiation increases little by little or in steps after the generation of the gas is little or stops substantially.

Accordingly, the time required for the photoresist treatment is shortened, and effective treatment of the photoresist, in which the deformation of the photoresist image is not caused by ultraviolet irradiation, is accomplished.

Other objects and advantages of this invention will become apparent embodiment from the following description of the preferred embodiment of the invention, taken in conjunction with the accompanying drawing.

DESCRIPTION OF THE PREFERRED EMBODIMENT

This invention will be described concretely hereinafter on the basis of embodiments shown in accompanying drawings.

Figure 1:
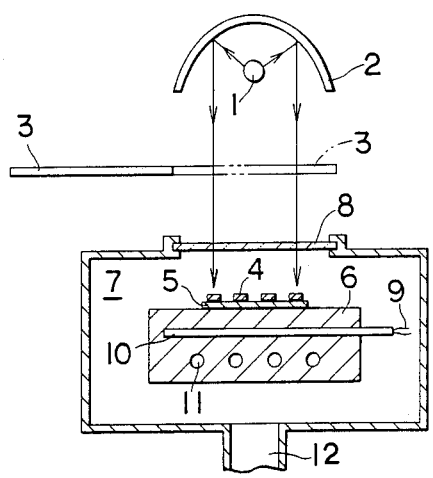
FIG. 1 shows an apparatus of treating photoresist for explaining one embodiment of a method of treating a photoresist image according to this invention.

In FIG. 1, a chamber 7 has a radiation window 8 formed of fused quartz glass at the top and an exhaust hole 12 at the bottom. The exhaust hole 12 is connected to a vacuum pump, not shown, which reduces the pressure of gas such as air in the chamber 7.

A pattern of a photoresist 4 is formed on a semiconductor wafer 5, which is placed on a support 6. The support 6 is heated by a heater 10 connected with power supply through a heater lead wire 9, or cooled down by cooling water to flow through a cooling conduit 11. The temperature of the semiconductor wafer 5 is controlled by these heating and cooling mechanisms. Ultraviolet irradiation source arranged on the upper part of the radiation window 8 is composed of a high pressure mercury vapor lamp 1, a concave mirror 2 and a shutter 3 which can be opened and closed, etc. The pressure of gas in a chamber 7 is reduced to approximately $1 \times 10^{-1}$ torr.

A figure of an electric circuit for energizing the high pressure mercury vapor lamp 1 is omitted. The intensity of ultraviolet radiation from a lamp is altered by controlling the electric power generated from said circuit. As to the electric circuit for lighting the high pressure mercury vapor lamp 1, publicly known or publicly used technique such as being disclosed in published documents, is available.

Figure 2:
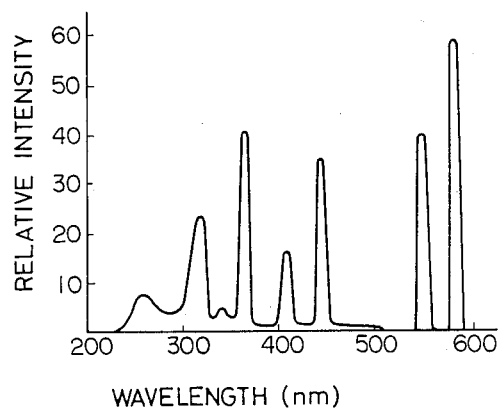
FIG. 2 shows radiation spectra of a high pressure mercury vapor lamp employed to execute the method of treating a photoresist image according to this invention.
Figure 3:
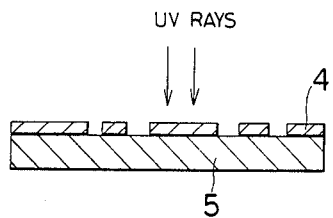
FIG. 3 shows a semiconductor wafer, on which the developed positive photoresist image is applied.

FIG. 2 shows the radiation spectrum of the high pressure mercury vapor lamp. FIG. 4 shows three examples of charts of the intensity of ultraviolet irradiation which increases little by little or in steps by changing the electric power of the electric circuit for lighting the high pressure mercury vapor lamp. This figure is an orthogonal coordinate system with relative intensity of ultraviolet irradiation as vertical axis and exposure time as lateral axis.

Figure 4A:
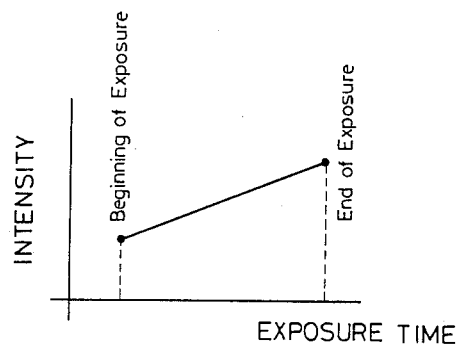
FIG.4 shows charts of the intensity of ultraviolet irradiation against exposure time.
Figure 4B:
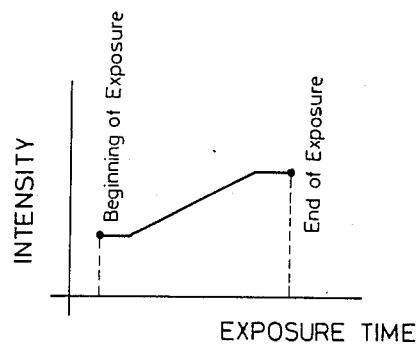
Figure 4C:
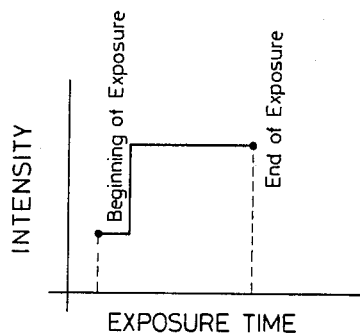

FIGS. 4(a), 4(b), 4(c) show changes of the intensity of ultraviolet irradiation, which increases little by little for all exposure time, increases little by little for intermediate exposure time and steps up in steps, respectively. The following is a ore concrete description as to FIG.

4(c). A positive type photoresist image which was formed on a wafer by using novolak resin was applied to the radiant light having a wavelength below 350 nm. The intensity of this irradiated light was 20 to 50 mW/cm$^2$ in the wavelength region below 320 nm for 5 seconds from the beginning of exposure process, and 500 mW/cm$^2$ for 10 seconds thereafter. In this case, deformation of the photoresist pattern, formations of bubbles and deformation of the photoresist film were not caused, and effective treatment of the photoresist was enabled. But, when the intensity of the irradiated light was 500 mW/cm$^2$ for 5 seconds from the beginning of the exposure, formation of bubbles, deformation of the photoresist film, etc. occurred in parts. When irradiation intensity is kept at 20 to 50 mW/cm$^2$ in order to depress the formation of bubbles for this reason, it takes 60 to 90 seconds to treat the developed positive photoresist on a semiconductor wafer.

Accordingly, exposure time for the ultraviolet radiation under a low atmospheric pressure is decreased by about ¼ to 1/6 times in comparison with that under 1 atmospheric pressure.

As result, arranging the photoresist in the reduced pressure has a remarkable effect for decreasing the time to treat the developed positive photoresist image on a wafer.

In the above-mentioned embodiment, the intensity of the light irradiated on the photoresist image placed under lower pressure is controlled by changing the intensity of the light radiated from the high pressure mercury vapor lamp. Another means of controlling the intensity of the light irradiated onto the photoresist can be employed instead of power control. For instance, means of controlling the intensity of the light irradiated onto the photoresist by employing a light source having means of decreasing ultraviolet irradiation such as filter prepared between high pressure mercury vapor lamp and wafer may be used as well.

What is claimed:

1. A method of enhancing the thermal stability of a developed positive photoresist image on a semiconductor wafer comprising the steps of:

placing the semiconductor wafer on a support in a chamber filled with gas at a pressure lower than atmospheric pressure, exposing the developed positive photoresist image to ultraviolet radiation of low intensity at the beginning of exposure;

and then exposing the developed positive photoresist image to ultraviolet radiation of progressively increasing intensity.

* * * * *